(12) United States Patent
Eger et al.

(10) Patent No.: US 9,175,145 B2
(45) Date of Patent: Nov. 3, 2015

(54) POLYMERIC EPOXY RESIN COMPOSITION

(75) Inventors: Christian Eger, Bardowick (DE); Stephan Sprenger, Oststeinbek (DE)

(73) Assignee: EVONIK HANSE GMBH, Geesthacht (DE)

( * ) Notice: Subject to any disclaimer, the term of this patent is extended or adjusted under 35 U.S.C. 154(b) by 1656 days.

(21) Appl. No.: 10/548,919

(22) PCT Filed: Feb. 25, 2004

(86) PCT No.: PCT/EP2004/001871
§ 371 (c)(1),
(2), (4) Date: Sep. 21, 2006

(87) PCT Pub. No.: WO2004/081076
PCT Pub. Date: Sep. 23, 2004

(65) Prior Publication Data
US 2007/0191556 A1     Aug. 16, 2007

(30) Foreign Application Priority Data

Mar. 11, 2003 (EP) .................................... 03005538
Mar. 12, 2003 (EP) .................................... 03005377

(51) Int. Cl.
| | |
|---|---|
| *C08L 63/00* | (2006.01) |
| *C08J 5/00* | (2006.01) |
| *B82Y 30/00* | (2011.01) |
| *C08G 59/18* | (2006.01) |
| *C08G 59/40* | (2006.01) |
| *C08G 59/58* | (2006.01) |
| *H05K 1/03* | (2006.01) |
| *C08K 3/36* | (2006.01) |

(52) U.S. Cl.
CPC ............... *C08J 5/005* (2013.01); *B82Y 30/00* (2013.01); *C08G 59/186* (2013.01); *C08G 59/4021* (2013.01); *C08G 59/58* (2013.01); *H05K 1/0373* (2013.01); *C08J 2363/00* (2013.01); *C08K 3/36* (2013.01); *H05K 2201/0209* (2013.01); *H05K 2201/0257* (2013.01)

(58) Field of Classification Search
CPC ............................. C08L 63/00; C09D 163/00
USPC ......................................................... 525/533
See application file for complete search history.

(56) References Cited

U.S. PATENT DOCUMENTS

| | | | |
|---|---|---|---|
| 5,686,509 A * | 11/1997 | Nakayama et al. | 523/201 |
| 2002/0009582 A1 * | 1/2002 | Golden | 428/306.6 |
| 2004/0147029 A1 * | 7/2004 | Adam | 436/8 |
| 2004/0181013 A1 * | 9/2004 | Schenkel | 525/406 |
| 2005/0022929 A1 * | 2/2005 | Schoenfeld et al. | 156/272.2 |

OTHER PUBLICATIONS

Sprenger et al. "Nanoadhesives: Toughness and High Strength," Kleben & Dichten (Mar. 2003).*
Cabot Corporation, "Cab-O-Sil TS-720 Treated Fumed Silica", 5 pages data sheet.
Cabot Corporation, "Cab-O-Sil TS-720 Treated Fumed Silica", 2 page data sheet.
Wacker, "Wacker HDK Pyrogenic Silica Structure of Fumed Silica", data sheet.

* cited by examiner

*Primary Examiner* — Megan McCulley
(74) *Attorney, Agent, or Firm* — Casimir Jones, S.C.

(57) ABSTRACT

The invention relates to a polymeric composition containing: a) at least one epoxy resin; b) at least one copolymer with groups, which react with epoxy resins, and with a glass transition temperature $T_g$ of −20° C. or lower, c) nanoparticles having a mean particle size $d_{max}$ ranging from 5 to 150 nm that is measured by means of a small-angle neutron scattering (SANS). The inventive composition enables the production of adhesives, composite materials, coatings and casting compounds exhibiting improved mechanical properties, particularly improve impact strength.

33 Claims, No Drawings

POLYMERIC EPOXY RESIN COMPOSITION

The invention relates to polymeric compositions based on epoxy resin. Epoxy resins are used extensively in the art for adhesives (hot-curing one-component adhesives and room temperature-curing two-component adhesives), as a resin component of composites, particularly fiber composites, for coatings, and as a casting compound, for the casting for example of electronic components. Epoxy resins in the cured state are generally hard and brittle. They possess low mechanical resistance particularly with regard to peel and impact stresses. Proposals have therefore already been made (WO-A-00/20483) to enhance the impact strength of the epoxy resins by means of heterodisperse incorporation of a modifying copolymer based on a carboxyl-functional butadiene-acrylonitrile rubber.

The invention is based on the object of creating a polymeric composition of the kind specified at the outset that has properties which are an improvement on the stated prior art.

The polymeric composition of the invention comprises the following constituents:
a) at least one epoxy resin,
b) at least one copolymer having groups that are reactive toward epoxy resins and having a glass transition temperature $T_g$ of
c) $-20°$ C. or less,
d) nanoparticles having an average particle size $d_{max}$ as measured by means of small-angle neutron scattering (SANS) of 5 to 150 nm.

First of all a number of terms used in the context of the invention will be elucidated.

Epoxy resins are monomers or prepolymers which contain on average two or more epoxide groups per molecule. Reaction of these epoxy resins with a number of known hardeners (curing agents) leads to crosslinked or thermocured thermosets. Epoxy resins which can be used in the context of the invention are described for example in Ullmann's Encyclopedia of Industrial Chemistry, 6th edition, volume A12, page 285 ff.

The copolymer provided in accordance to the invention must possess reactive groups that are able to react with the epoxy groups of the epoxy resin and so bind the copolymer chemically into the epoxy resin. The term "copolymer" in this context implies that by virtue of these reactive groups the polymer is able to react chemically with the epoxy resin. This copolymer having reactive groups may in structural terms be a homo- or co-polymer or -oligomer. The copolymer has a glass transition temperature $T_g$ of $-20°$ C. or less. In the polymer of the invention after curing thereof it forms phases referred to as rubber domains, which possess this stated glass transition temperature. The rubber domains are phases containing essentially only the copolymer, which are incorporated in the epoxy resin and bring about modification of the mechanical properties, particularly the impact strength. Within these rubber domains it is possible essentially for only van der Waals forces to act, for example, between the copolymer molecules; in the border region with the epoxy resin matrix, owing to the epoxide-reactive groups, there is penetration of the copolymer into the epoxy resin matrix. After it is cured, the polymeric composition of the invention is in a state which may be regarded as on the border between a true two-phase system (epoxy resin matrix with rubber domains) and an interpenetrating network.

A further constituent of the composition of the invention are nanoparticles having an average particle size $d_{max}$ of 5 to 150 nm. The method used for measuring the average particle size is that of small-angle neutron scattering (SANS). This measurement method is familiar to the skilled worker and requires no further elucidation here. With the SANS measurement a particle size distribution curve is obtained in which the volume fraction of particles of corresponding size (diameter) is plotted against the particle diameter. The average particle size is defined as the peak of such a SANS distribution curve, in other words the largest volume fraction with particles of corresponding diameter.

The invention is based on the finding that the modification of epoxy resins with copolymers that form rubber domains, on the one hand, and nanoparticles on the other hand, produces a significant and unexpected improvement in the mechanical properties of a cured polymeric composition of the invention. After crosslinking and curing, thermosets are obtained with substantially improved fracture toughness and impact strength, with other important properties characteristic of thermosets, such as strength, heat distortion resistance, and chemical resistance, remaining substantially unaffected. For the skilled worker it was not to have been expected that the combination of the modification of epoxy resin materials with polymers on the one hand and nanopartides on the other, both of which are known per se, would have a synergistic effect and would produce a distinct improvement in the mechanical properties.

The epoxy resins may for example be glycidyl-based resins. Glycidyl-based resins are obtainable by reacting epichlorohydrin with compounds having at least two reactive hydrogen atoms per molecule. These may be, for example, polyphenols, monoamines and diamines, amino phenols, heterocyclic imides and amides, aliphatic diols and polyols, and dimeric fatty acids. Among the glycidyl-based epoxy resins the polyglycidyl ethers are preferred. Particularly preferred epoxy resins are those based on the diglycidyl ether of bisphenol A (DGEBA). Additionally it is possible to use epoxy resins based on epoxidized aliphatic or, preferably, cycloaliphatic dienes.

The selection of preferred epoxy resins is also dependent on the intended application of the polymeric composition of the invention; this is elucidated in greater detail later on below.

When reference is made in the context of the invention to a polymeric composition, this term embraces not only the as yet uncrosslinked or uncured mixture of the corresponding constituents but also a thermoset material produced therefrom. The mixtures that are still reactive may be either one-component mixtures, which can be brought to reaction by means of external influences (for example, heat-curing one-component adhesives), or multicomponent mixtures, in which curing to the thermoset material begins after the components have been mixed (examples being two-component epoxy resin adhesives).

The glass transition temperature $T_g$ of the domains (rubber domains of the copolymer) is preferably not more than $-30°$ C., more preferably $-40$, $-50$ or $-60°$ C. Preferably it is not below $-100°$ C. The preferred glass transition temperature is also dependent on the intended application of the polymeric compositions of the invention. When they are employed as structural adhesives in vehicle construction or aircraft engineering, for example, an important factor is a high impact-strength even at low temperatures, in order to ensure adequate strength of the bond even in the event of accident (crash safety). Common testing temperatures for the strength of structural adhesive bonds in automotive engineering are for example $-40°$ C., in aircraft engineering $-60°$ C.

The fraction of the copolymer as a proportion of the polymeric composition of the invention is preferably 2% to 30% by weight, more preferably 4% to 18% by weight. The copolymers are in general not readily miscible with the epoxy resin. When preparing a composition of the invention, therefore, it is usual first to prepare what are called adducts or prepolymers, by chemically reacting the copolymers with an excess of epoxy resin. These adducts are infinitely miscible with all common epoxy resins. In the context of the invention, therefore, it is not necessary for the copolymer still to have reactive groups when it is mixed with the other constituents of the polymeric composition. Instead it is preferred to cause these reactive groups to be consumed by reaction with a portion of the epoxy resin in a precursor stage, said epoxy resin fraction having a molar excess of epoxy groups over the reactive groups over the reactive groups of the copolymer. The invention accordingly provides a polymeric composition as defined by claim 1 independently of the order in which those constituents are combined and, where appropriate, caused to react and of whether this takes place in one stage or in two or more successive process steps. The curing of a composition of the invention is then accompanied by phase separation, and within the epoxy resin matrix the above-described rubber domains are formed, these domains being bound into the matrix chemically via the epoxide end groups.

The rubber domains in the cured composition preferably possess an average size as determined by SEM or TEM of 0.05 to 20 μm, more preferably 0.1 to 10 μm, more preferably 0.2 to 4 μm.

Examples of the copolymers are 1,3-diene polymers with carboxyl groups and further polar ethylenically unsaturated comonomers. The diene used can be butadiene, isoprene or chloroprene, butadiene being preferred. Examples of polar, ethylenically unsaturated comonomers are acrylic acid, methacrylic acid, lower alkyl esters of acrylic or methacrylic acid, such as their methyl or ethyl esters, for example, amides of acrylic or methacrylic acid, fumaric acid, itaconic acid, maleic acid or their lower alkyl esters or monoesters, or maleic anhydride or itaconic anhydride, vinyl esters such as vinyl acetate, for example, or, in particular, acrylonitrile or methacrylonitrile. Especially preferred copolymers are carboxyl-terminated butadiene-acrylonitrile copolymers (CTBN), or amino-functional butadiene-acrylonitrile copolymers (ATBN), which are offered in liquid form under the trade name Hycar by the company Noveon (formerly B.F. Goodrich). These copolymers have molecular weights of between 2000 and 5000 and acrylonitrile contents of between 10% and 30%. Specific examples are Hycar CTBN 1300×8, 1300×13, 1300×18 or ATBN 1300×16.

The invention envisages curing systems that are familiar to the skilled worker and are known for the hardening of epoxy resin.

Examples of possible heat-activable or latent hardeners for the epoxy resin include guanidines, substituted guanidines, substituted ureas, melamine resins, guanamine derivatives, cyclic tertiary amines, aromatic amines and/or mixtures thereof. The hardeners may be included stoichiometrically in the curing reaction or alternatively they may be catalytically active. Examples of substituted guanidines are methylguanidine, dimethylguanidine, trimethylguanidine, tetramethylguanidine, methylisobiguanidine, dimethylisobiguanidine, tetramethylisobiguanidine, hexamethylisobiguanidine, heptamethylisobiguanidine, and, very particularly, cyanoguanidine (dicyandiamide). As representatives of suitable guanamine derivatives mention may be made of alkylated benzoguanamine resins, benzoguanamine resins or methoxymethylethoxymethylbenzoguanamine. For heat-curing one-component paste adhesives, dicyandiamide is suitable. This ensures that the stability of the composition on storage is good.

As well as or instead of the aforementioned hardeners it is possible to use substituted ureas that are catalytically active. These are, in particular, p-chlorophenyl-N,N-dimethylurea (monuron), 3-phenyl-1,1-dimethylurea (fenuron) or 3,4-dichlorophenyl-N,N-dimethylurea (diuron). In principle it is also possible to use catalytically active tertiary acryloyl- or alkyl-amines, such as, for example, benzyldimethyl-amine, tris(dimethylamino)phenol, piperidine, or piperidine derivatives. It is additionally possible to use various imidazole derivatives, preferably solid ones, as catalytically active accelerators or sole hardeners. Representatives that may be mentioned include 2-ethyl-2-methylimidazole, N-butylimidazole, benzimidazole, and also N—$C_1$ to $C_{12}$-alkylimidazoles or N-arylimidazoles. In addition it is possible for the compositions of-the invention to comprise customary further auxiliaries and additives such as, for example, plasticizers, reactive diluents, rheological assistants, wetting agents, aging inhibitors, stabilizers and/or color pigments.

The compositions of the invention can be formulated as one-component adhesives, which in turn can be formulated either as high-viscosity adhesives for hot application or else as thermally curable hotmelt adhesives.

The compositions of the invention can also be formulated as two-component epoxy adhesives, where the two reaction components are not mixed with one another until shortly before application, curing then taking place at room temperature or moderately elevated or lowered temperature. As the second reaction component in this case it is possible to use the reaction components that are known per se for two-component epoxy adhesives, examples being diamines or polyamines, amino-terminated polyalkylene glycols (e.g., Jeffamines, amino-polyTHF) or polyaminoamides. Further reactive partners may be mercapto-functional prepolymers such as, for example, the liquid Thiokol polymers. In principle the epoxy compositions of the invention may also be cured with carboxylic anhydrides as the second reaction component.

The fraction of the hardener relative to the total amount of epoxy resin and hardener can be preferably between 4% and 50% by weight.

The nanoparticles are preferably selected from the group consisting of silicon dioxides, carbonates (chalks for example), and montmorillonite. Particular preference is given to silicon dioxide nanoparticles of the kind disclosed in WO-A-02/083776. The nanoparticles are preferably surface-modified in order to prevent or reduce their agglomeration and to facilitate incorporation into the resin matrix. In the case of silicon dioxides a preferred surface modification is that of silanization with suitable silanes.

The silanes may contain hydrolyzable and nonhydrolyzable, optionally functional groups. Examples of hydrolyzable groups are halogen, alkoxy, alkenoxy, acyloxy, oximino, and amino groups. Examples of functional, nonhydrolyzable groups are vinyl, aminopropyl, chloropropyl, aminoethylaminopropyl, glycidyloxypropyl, mercaptopropyl or methacryloyloxypropyl groups. Examples of nonhydrolyzable, nonfunctional groups are monovalent $C_1$ to $C_8$ hydrocarbon radicals. Examples of silanes which can be used in accordance with the invention are as follows: γ-aminopropyltrimethoxysilane, γ-aminopropylmethyl-diethoxysilane, γ-aminopropyldimethylmethoxysilane, glycidyloxypropyltrimethoxysilane, methacryloyloxypropyltrimethoxysilane, chloropropyltrimethoxysilane, vinylmethyldimethoxysilane, vinyltrispropenoxysilane, vinyldimethylbutanoxime silane, vinyltrisbutanone oxime silane, trimethylchlorosilane, vinyldimethylchlorosilane, dimethylchlorosilane, and vinylmethylchlorosilane.

The silanes are used preferably in a concentration of 40 to 200 mol % and with particular preference of 60 to 150 mol %, relative to the molar amount of silanol groups on the surface of the nanoparticles.

The average particle size $d_{max}$ of the nanoparticles is preferably between 6 and 100 nm, more preferably 6 and 40 nm, more preferably 8 and 30 nm, more preferably 10 and 25 nm. The maximum width at half peak height of the distribution curve of the particle size of the nanoparticles is preferably not more than 1.5 $d_{max}$, more preferably not more than 1.2 $d_{max}$, more preferably not more than 0.75 $d_{max}$. The width at half peak height of the distribution curve is the width (in nm) of the distribution curve at half peak height, in other words at half of the particle volume fraction at the peak of the distribution curve $d_{max}$, or (expressed alternatively) the width of the distribution curve at half the height of the Y axis (relative to the height of the curve at $d_{max}$).

The nanoparticles may have a monomodal or multimodal distribution curve. A monomodal distribution curve has only one maximum. A multimodal distribution curve has two or more maxima, and hence within the stated range from 5 to 150 nm there are two or more maxima $d_{max}$ in the curve. Among the nanoparticles having multimodal distribution curves, particles having a bimodal or trimodal distribution curve are preferred. In the case of multimodal distribution curves the width of the curve at half peak height is determined separately for each maximum.

The invention further provides an adhesive comprising a polymeric composition of the invention. Earlier on above, one-component and two-component epoxy resin adhesives, and their possible use particularly for structural bonds in vehicle construction and aircraft engineering, were elucidated. In the case of adhesives the epoxy resins are preferably selected from the group consisting of bisphenol A- and bisphenol F-based resins. The fraction of the nanoparticles as a proportion of the polymeric composition is in the case of adhesives preferably 0.5% to 5% by weight, more preferably 1% to 3% by weight. It has emerged that adhesives of the invention having nanoparticle contents of well above 2% by weight no longer retain any significant improvement in impact strength (as measured by means of tensile shear tests in accordance with DIN 55283).

The invention further provides composites comprising polymeric compositions of the invention. These are, in particular, fiber composites such as glass fiber or carbon fiber composites. The polymeric composition of the invention in such a composite is the impregnating resin. The impregnating resin is the matrix resin in which the fibers or fabrics are embedded, irrespective of the embedment process. In view of the very low particle size of the nanoparticles, a polymeric composition of the invention, in the form of an impregnating resin, is readily able to penetrate even close-packed reinforcing fibers, such as are envisaged for heavy-duty composites. As a result, the advantageous mechanical properties of the composition of the invention are able to develop within the whole component. For use in the context of composites the epoxy resins are preferably selected from the group consisting of bisphenol A- and bisphenol F-based resins, novolak resins, and aromatic glycidylamines. The fraction of the nanoparticles as a proportion of the polymeric composition is preferably 3% to 20% by weight, more preferably 6% to 10% by weight. Composites of the invention can be used for example for producing printed circuit boards, structural components for vehicles and aircraft, sports goods, radar masts, windmill sails or the like.

The invention further provides coatings comprising a polymeric composition of the invention. Such coatings may for example be paints, varnishes or other coatings. In the case of coatings it is particularly advantageous that by virtue of the presence of nanoparticles the abrasion resistance and scratch resistance and also the barrier effect with respect to penetration of the coating by gases and moisture are enhanced. For use in the case of coatings the epoxy resins of the polymeric composition of the invention are preferably selected from the group consisting of bisphenol A- and bisphenol F-based resins and also epoxidized cycloaliphatics. The fraction of the nanoparticles as a proportion of the polymeric composition is preferably 10% to 50% by weight, more preferably 20% to 50% by weight.

The invention further provides casting compounds comprising a polymeric composition of the invention. Casting compounds are used in the electrical and electronics industry as electrical insulating resins during the casting, for example, of coils or transformers, or as a die-attach adhesive for bonding components to printed circuit boards. In the case of coil casting it is important that the casting compound (the impregnating resin) is able to flow very easily and without defect through the spacings in the turns of the coil, which are often just a few μm in size. This is possible without problems in the case of the nanofilled polymeric compositions of the invention. For use in the context of casting compounds the epoxy resins are preferably selected from the group consisting of bisphenol A- and bisphenol F-based resins and also of epoxidized cycloaliphatics. The fraction of the nanoparticles as a proportion of the polymeric composition is preferably 10% to 50% by weight, more preferably 20% to 50% by weight.

The invention hence also provides for the use of a polymeric composition of the invention to produce a product selected from the group consisting of adhesives, composites, coatings, and casting compounds.

The invention is elucidated below with reference to examples.

EXAMPLES 1 and 2

Formulating Heat-curing One-component Adhesives.

Heat-curing one-component adhesives in accordance with the formula in Table 1 below were used. The numerical indications in the table are weight fractions. Examples 1 and 2 are inventive examples, control 1 is an epoxy resin, and control 2 is an epoxy resin with a CTBN copolymer.

TABLE 1

|  | Cont. 1 | Cont. 2 | Ex. 1 | Ex. 2 |
|---|---|---|---|---|
| DGEBA | 100 | 77.5 | 73.7 | 76.0 |
| Nano-adduct | — | — | 43.8 | 40.0 |
| Albipox 2000 | — | 37.5 | — | — |
| Cabot TS 720 | 2 | 2 | 2 | 2 |
| Dyhard 100 SF | 4 | 4 | 4 | 4 |
| Dyhard UR 300 | 2 | 2 | 2 | 2 |
| % by weight nanoparticles | 0 | 0 | 2.0 | 0.81 |

DGEBA: diglycidyl ether of bisphenol A
Nanoadduct: monomodal $SiO_2$ with a $d_{max}$ of 20 nm in an adduct of DGEBA epoxy resin and the CTBN rubber Hycar 1300 × 13.
Albipox 2000: rubber-modified epoxy resin, resin basis DGEBA, NBR rubber content 40% (from hanse chemie GmbH)
Cabot TS 720: pyrogenic silica as thixotropic agent
Dyhard 100 SF: heat hardener based on dicyandiamide
Dyhard UR 300: hardening accelerator based on monuron (p-chlorophenyl-N,N-dimethylurea)

EXAMPLES 3 and 4

Two-component Adhesives

Two-component adhesives were prepared in accordance with the formulas in Table 2. The numerical indications in the table are parts by mass. Examples 3 and 4 are inventive example, control 3 is a comparative example without nanoparticles.

TABLE 2

|  | Cont. 3 | Ex. 3 | Ex. 4 |
|---|---|---|---|
| Component A |  |  |  |
| DGEBA | 100 | 92.5 | 96.25 |
| Nanopox | — | 12.5 | 6.25 |
| Component B |  |  |  |
| Polypox P 502 | 91.5 | 88.9 | 90.4 |
| Hycar 1300 × 16 | 45.8 | 44.5 | 45.2 |
| % by weight nanoparticles | 0 | 2.1 | 1.05 |

Nanopox: 40% by weight Nano-SiO$_2$ with a d$_{max}$ of 20 nm in DGEBA
Polypox p 502 hardener based on isophoronediamine (manufacturer UPPC)
Hycar 1300 × 16: ATBN obtainable from the company Noveon

EXAMPLE 5

Tensile Shear Strength Tests

The one-component adhesives of Table 1 and the components A and B of the two-component adhesives of Table 2 were applied to untreated aluminum for tensile shear tests in accordance with DIN 55283. The thickness of the adhesive layer was adjusted to 0.5 mm by means of glass beads. The adhesives of Table 1 were cured at 120° C. for 1 hour and then at 180° C. for two hours. The two-component adhesives of Table 2 were cured at room temperature for 24 hours and at 60° C. for two hours.

The following tensile shear strengths (measured in MPa) were measured:
Control 1: 10.9
Control 2: 16.7
Example 1: 18.3
Example 2: 20.1
Control 3: 13.4
Example 3: 17.8
Example 4: 19.2

The invention claimed is:
1. A polymeric composition comprising:
a) at least one epoxy resin,
b) at least one copolymer having epoxide-reactive groups and a glass transition temperature $T_g$ of −20° C. or less,
c) nanoparticles having an average particle size $d_{max}$ as measured by means of small-angle neutron scattering of 5 to 40 nm,
wherein when the composition is cured, the copolymer forms rubber domains having an average size of 0.05 to 20 μm.
2. The composition of claim 1, wherein said at least one epoxy resin is selected from the group consisting of polyglycidyl ethers and epoxidized cycloaliphatics.
3. The composition of claim 1, wherein the glass transition temperature $T_g$ of the copolymer is −20 to −100° C.
4. The composition of claim 3, wherein the glass transition temperature $T_g$ of the copolymer is −30 to −100° C.
5. The composition of claim 3, wherein the glass transition temperature $T_g$ of the copolymer is −40 to −100° C.
6. The composition of claim 3, wherein the glass transition temperature $T_g$ of the copolymer is −50 to −100° C.
7. The composition of claim 3, wherein the glass transition temperature $T_g$ of the copolymer is −60 to −100° C.
8. The composition of claim 1, wherein the fraction of the copolymer as a proportion of the composition is 2% to 30% by weight.
9. The composition of claim 8, wherein the fraction of the copolymer as a proportion of the composition is 4% to 18% by weight.
10. The composition of claim 1, wherein the copolymer is a carboxy-terminated butadiene-acrylonitrile.
11. The composition of claim 1, wherein the nanoparticles are selected from the group consisting of silicon dioxides, carbonates, and montmorillonite.
12. The composition of claim 1, wherein the average particle size $d_{max}$ of the nanoparticles is between 8 and 30 nm.
13. The composition of claim 12, wherein the average particle size $d_{max}$ of the nanoparticles is between 10 and 25 nm.
14. The composition of claim 1, wherein the maximum width at half peak height of the distribution curve of the particle size of the nanoparticles is not more than 1.5 $d_{max}$.
15. The composition of claim 14, wherein the maximum width at half peak height of the distribution curve of the particle size of the nanoparticles is not more than 1.2 $d_{max}$.
16. The composition of claim 14, wherein the maximum width at half peak height of the distribution curve of the particle size of the nanoparticles is not more than 0.75 $d_{max}$.
17. The composition of claim 1, wherein the nanoparticles have a monomodal or multimodal distribution curve.
18. The composition of claim 17, wherein the distribution curve is monomodal, bimodal or trimodal.
19. An adhesive comprising a polymeric composition of claim 1.
20. The adhesive of claim 19, wherein said at least one epoxy resin is selected from the group consisting of bisphenol A- and bisphenol F-based resins.
21. The adhesive of claim 19, wherein the fraction of the nanoparticles as a proportion of the polymeric composition is 0.5% to 5% by weight.
22. A composite comprising a polymeric composition of claim 1.
23. The composite of claim 22, wherein said at least one epoxy resin is selected from the group consisting of bisphenol A- and bisphenol F-based resins, novolak resins, and aromatic glycidyl-amines.
24. The composite of claim 22, wherein the fraction of the nanoparticles as a proportion of the polymeric composition is 3% to 20% by weight.
25. A coating comprising a polymeric composition of claim 1.
26. The coating of claim 25, wherein said at least one epoxy resin is selected from the group consisting of bisphenol A- and bisphenol F-based resins, and also epoxidized cycloaliphatics.
27. The coating of claim 25, wherein the fraction of the nanoparticles as a proportion of the polymeric composition is 10% to 50% by weight.
28. A casting compound comprising the polymeric composition of claim 1.
29. The casting compound of claim 28, wherein said at least one epoxy resin is selected from the group consisting of bisphenol A- and bisphenol F-based resins.
30. The casting compound of claim 28, wherein the fraction of nanoparticles as a proportion of the polymeric composition is 10% to 50% by weight.
31. Method of forming a product using a polymeric composition, comprising:

i.) providing the polymeric composition of claim 1; and ii) producing a product using said composition, wherein said product is selected from the group consisting of an adhesive, a composite material, a coating, and a casting compound.

32. The composition of claim 1, wherein in the cured composition the copolymer forms rubber domains having an average size of 0.1 to 10 μm.

33. The composition of claim 1, wherein in the cured composition the copolymer forms rubber domains having an average size of 0.2 to 4 μm.

* * * * *